US012727371B2

(12) United States Patent
Zhou

(10) Patent No.: US 12,727,371 B2
(45) Date of Patent: Sep. 1, 2026

(54) DISPLAY PANEL, DISPLAY MODULE, AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Wenjun Zhou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 470 days.

(21) Appl. No.: 17/597,239

(22) PCT Filed: Dec. 23, 2021

(86) PCT No.: PCT/CN2021/140907
§ 371 (c)(1),
(2) Date: Dec. 29, 2021

(87) PCT Pub. No.: WO2023/115465
PCT Pub. Date: Jun. 29, 2023

(65) Prior Publication Data

US 2023/0200122 A1 Jun. 22, 2023

(30) Foreign Application Priority Data

Dec. 22, 2021 (CN) ......................... 202111576368.9

(51) Int. Cl.
*H10K 59/80* (2023.01)
*H10K 59/35* (2023.01)

(52) U.S. Cl.
CPC ......... *H10K 59/8792* (2023.02); *H10K 59/35* (2023.02)

(58) Field of Classification Search
CPC ...... H10K 50/865; H10K 59/35; H10K 59/38; H10K 50/844; H10K 59/8792;
(Continued)

(56) References Cited

U.S. PATENT DOCUMENTS

2003/0230972 A1* 12/2003 Cok ....................... H10K 59/38
313/504
2014/0127480 A1* 5/2014 Masuda ................ B29C 69/004
156/268

(Continued)

FOREIGN PATENT DOCUMENTS

CN 108666352 A 10/2018
CN 110208978 A 9/2019

(Continued)

OTHER PUBLICATIONS

International Search Report issued in International application No. PCT/CN2021/140907, mailed on Sep. 21, 2022, with English translation.

(Continued)

*Primary Examiner* — Julio J Maldonado
*Assistant Examiner* — Nathan Pridemore
(74) *Attorney, Agent, or Firm* — HSML P.C.

(57) ABSTRACT

The present disclosure is related to an organic light-emitting diode apparatus. The organic light-emitting diode apparatus may include a substrate and a plurality of pixels on a first side of the substrate. Each of the plurality of pixels may include a display region and a non-display region. The non-display region may be provided with a control circuit and a first color film, and the first color film may be between the control circuit and the substrate.

16 Claims, 10 Drawing Sheets

(58) Field of Classification Search
CPC ...... H10K 71/851; H10K 59/12; H10K 59/87; H10K 59/873; H10K 2102/351; H10K 59/126; H10K 59/8791; H10K 50/86
See application file for complete search history.

(56) References Cited

U.S. PATENT DOCUMENTS

| | | | | |
|---|---|---|---|---|
| 2015/0102304 | A1 | 4/2015 | Go | |
| 2018/0061638 | A1* | 3/2018 | Yamazaki | H01L 31/1892 |
| 2019/0355927 | A1 | 11/2019 | Park | |
| 2020/0020757 | A1 | 1/2020 | Li et al. | |
| 2020/0259119 | A1* | 8/2020 | Jung | H01L 25/18 |
| 2020/0301474 | A1 | 9/2020 | Yug | |
| 2021/0242433 | A1* | 8/2021 | Xiao | H10K 59/38 |
| 2022/0415963 | A1* | 12/2022 | Park | H10H 20/857 |

FOREIGN PATENT DOCUMENTS

| | | | |
|---|---|---|---|
| CN | 111430442 | A | 7/2020 |
| CN | 112885243 | A | 6/2021 |
| CN | 113571658 | A | 10/2021 |
| CN | 113707699 | A | 11/2021 |
| CN | 214847489 | U | 11/2021 |
| CN | 114300482 | A | 4/2022 |
| EP | 4456114 | A1 | 10/2024 |
| JP | 2017128083 | A | 7/2017 |
| JP | 2017220459 | A | 12/2017 |
| JP | 2018093169 | A | 6/2018 |
| JP | 6462839 | B2 | 1/2019 |
| JP | 2019124745 | A | 7/2019 |
| JP | 2020019070 | A | 2/2020 |
| JP | 2020088217 | A | 6/2020 |
| JP | 2021124574 | A | 8/2021 |
| JP | 2021150117 | A | 9/2021 |
| KR | 20170133582 | A | 12/2017 |
| KR | 20190007981 | A | 1/2019 |
| WO | 2019114204 | A1 | 6/2019 |

OTHER PUBLICATIONS

Written Opinion issued in International application No. PCT/CN2021/140907, mailed on Sep. 21, 2022, with English translation.
Japanese Office Action issued in corresponding Japanese Patent Application No. 2022-530789, dated Jan. 29, 2024, pp. 1-5, with English translation.
Korean Office Action issued in corresponding Korean Patent Application No. 10-2022-7009460, dated Feb. 26, 2024, pp. 1-9, with English translation.
Office Action issued in corresponding Chinese Patent Application No. 202111576368.9 dated Jun. 29, 2024, with machine translation, 18 pages.
Office Action issued in corresponding Korean Patent Application No. 10-2025-7002127 dated Mar. 1, 2025, 12 pages w/translation.
Office Action issued in corresponding Chinese Patent Application No. 202411898010.1 dated Aug. 29, 2025, with machine translation, 13 pages provided.
Office Action issued in corresponding European Patent Application No. 21927053.5, dated Oct. 17, 2025, 9 pages provided.
Office Action issued in corresponding Korean Patent Application No. 10-2025-7002127, dated Oct. 21, 2025, machine translation provided, 21 pages provided.
Office Action issued in corresponding Chinese Patent Application No. 202411898010.1, dated Oct. 30, 2025, machine translation provided, 8 pages provided.

* cited by examiner

DISPLAY PANEL, DISPLAY MODULE, AND MOBILE TERMINAL

FIELD OF DISCLOSURE

The present disclosure relates to the field of display technologies, in particular to a display panel, a display module, and a mobile terminal.

BACKGROUND

Organic light-emitting diode (OLED) panels have advantages of lightness, thinness, large viewing angles, and power saving, and become a mainstream of future development.

In existing OLED display panels, in order to reduce a thickness of a display panel, the OLED panel can be made by using a non-polarizer technology. That is, an existing polarizer is replaced by a color resist layer and a black matrix layer. When cutting the panel, it is necessary to use a laser L to cut the black matrix on a periphery of the display panel. High temperature of the laser L will cause a carbonization of the black matrix. Carbonized carbon fragments may remain in gaps between edges of the display panel, affecting a cleanliness of the display panel.

Therefore, a display panel is necessary to solve the above technical problems.

SUMMARY OF DISCLOSURE

The present disclosure provides a display panel, a display module, and a mobile terminal to solve a technical problem of carbon fragments in gaps between edges of an existing display panel.

The present disclosure provides a display panel, including:

- a substrate;
- a light-emitting device layer disposed on the substrate; and
- a color film layer disposed on the light-emitting device layer, wherein the color film layer comprises a light-shielding layer and a plurality of color resist units embedded in the light-shielding layer, and the light-shielding layer comprises a first light-shielding portion disposed close to a cutting surface of the display panel.

The first light-shielding portion comprises a first edge close to the cutting surface, the substrate comprises a second edge close to the cutting surface, and a distance between the first edge and the cutting surface is greater than a distance between the second edge and the cutting surface.

In the display panel of the present disclosure, the distance between the first edge and the cutting surface is greater than or equal to 50 micrometers and less than or equal to 150 micrometers.

In the display panel of the present disclosure, the light-shielding layer further comprises a second light-shielding portion away from the cutting surface, and a thickness of the second light-shielding portion is greater than a thickness of the first light-shielding portion.

In the display panel of the present disclosure, the display panel further comprises a first planarization layer disposed on the color film layer, and the first planarization layer covers the color film layer.

The first planarization layer covers the first light-shielding portion and extends to the cutting surface.

In the display panel of the present disclosure, the display panel further comprises a first planarization layer disposed on the color film layer, and the first planarization layer covers the color film layer.

An area of the light-shielding layer close to the cutting surface of the display panel is provided with a first notch, an area of the first planarization layer close to the cutting surface is provided with a second notch, and the first notch and the second notch face the cutting surface.

In the display panel of the present disclosure, a thickness of the first planarization layer is less than or equal to the thickness of the second light-shielding portion.

In the display panel of the present disclosure, in a direction from the substrate to the color film layer, a distance between a film boundary on a side of the display panel close to the cutting surface and the second edge gradually increases.

In the display panel of the present disclosure, an acute angle between the cutting surface and the substrate ranges from 60° to 80°.

In the display panel of the present disclosure, the display panel comprises a plurality of organic layers, one side of at least one of the organic layers close to the cutting surface is provided with a black material.

The present disclosure also provides a display module. The mobile terminal includes the above-mentioned display panel and a cover layer disposed on the display panel;

An orthographic projection of the display panel on the cover layer is within the cover layer.

The present disclosure also provides a mobile terminal. The mobile terminal includes a terminal body and the above-mentioned display module, and the terminal body and the display module are assembled together.

In the present disclosure, the distance between the first edge and the cutting surface is greater than the distance between the second edge and the cutting surface, so that the light-shielding layer is separated from the cutting surface. It prevents the light shielding material from being carbonized due to a high temperature of the laser L during a cutting process, thereby preventing carbonized carbon fragments from remaining in edge gaps of the display panel, and improving a cleanliness of the product.

DETAILED DESCRIPTION

In order to make purposes, technical solutions, and effects of the present disclosure clearer and specific, the present disclosure will be further described in detail below with reference to accompanying drawings and embodiments. It should be understood that the specific embodiments described herein are only used to explain the present disclosure, and not used to limit the present disclosure.

Figure 1:
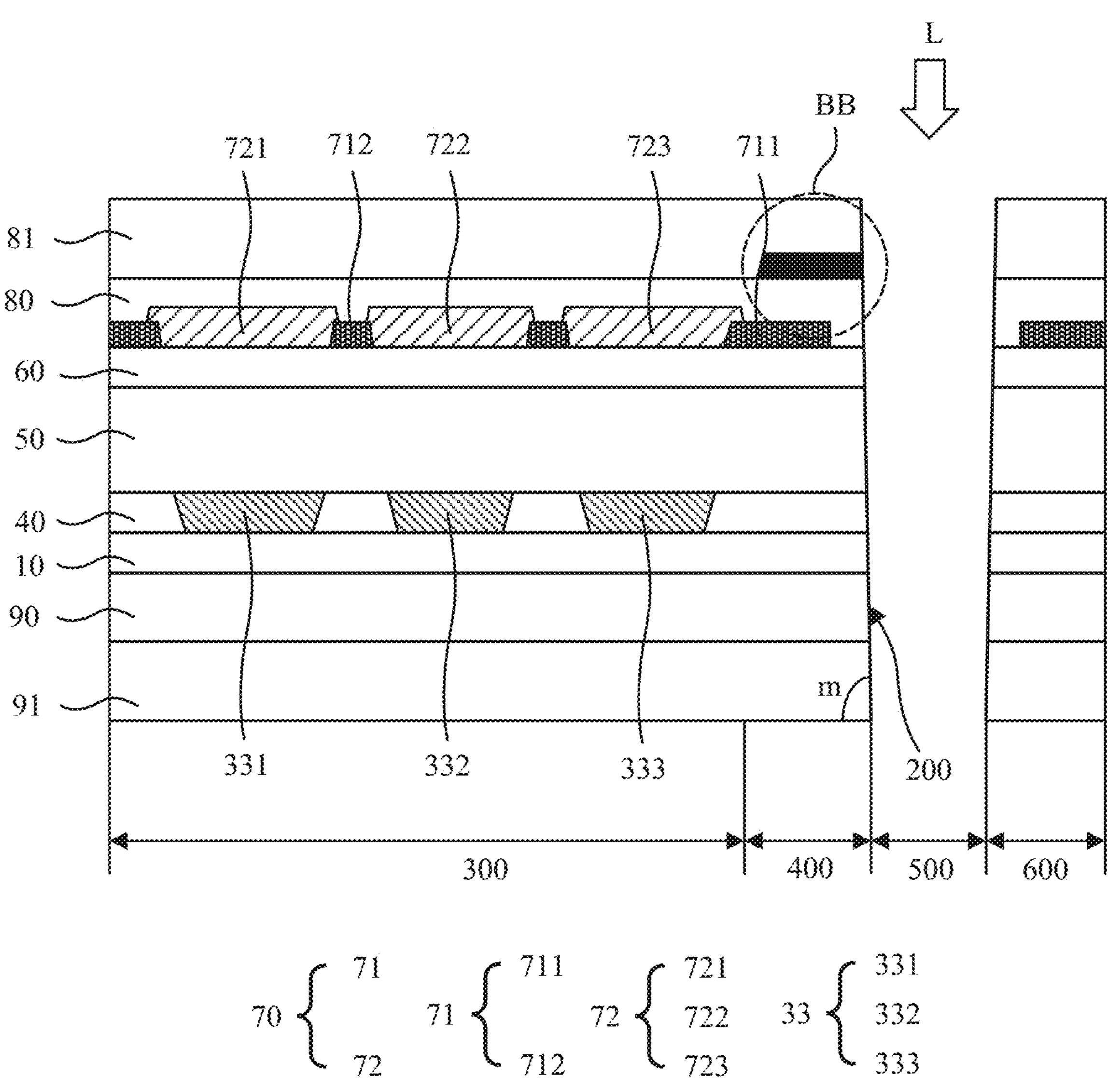
FIG. 1 is a cross-sectional view of a display panel in the prior art.
Figure 2:
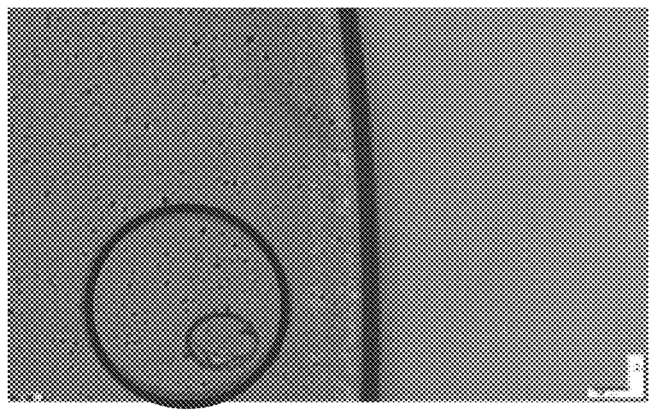
FIG. 2 is an enlarged view of an abnormal area of the display panel in the prior art.

Referring to FIG. 1, which is a schematic diagram of a film structure of a display panel after cutting in the prior art. In existing OLED display panels, in order to reduce a thickness of a display panel, the OLED panel can be made by using a non-polarizer technology. That is, an existing polarizer is replaced by a color resist layer and a black matrix layer. In order to ensure a flatness of the product, it usually coats a first planarization layer on a color film layer, and attaches a protective layer to the first planarization layer to protect the film layer. When cutting the panel, a temperature of a laser L may carbonize a black light-shielding layer 71 close to a cutting surface 200. At the same time, since a separation force between a first protective layer 81 and a first planarization layer 80 is small, a carbonized black material falls into gaps between the first protective layer 81 and the first planarization layer 80, which affects a cleanliness of the display panel. For details, refer to FIG. 2, a circled structure in the figure is a black unevenness matter in an area BB in FIG. 1. Therefore, the present disclosure provides a display panel to solve the above technical problems Referring to FIG. 3 to FIG. 12, the present disclosure provides a display panel 100, which may include a substrate 10, a light-emitting device layer 30, and a color film layer 70. The light-emitting device layer 30 is disposed on the substrate 10. The color film layer 70 is disposed on the light-emitting device layer 30. The color film layer 70 includes a light-shielding layer 71 and a plurality of color resist units 72 embedded in the light-shielding layer 71. The light-shielding layer 71 includes a first light-shielding portion 711 disposed close to a cutting surface 200 of the display panel 100.

The first light-shielding portion 711 includes a first edge M1 close to a side of the cutting surface 200. The substrate 10 includes a second edge M2 close to the cutting surface 200. A distance between the first edge M1 and the cutting surface 200 is greater than a distance between the second edge M2 and the cutting surface 200.

In the present disclosure, the distance between the first edge M1 and the cutting surface is greater than the distance between the second edge M2 and the cutting surface, so that the light-shielding layer 71 is separated from the cutting surface 200. It prevents a light shielding material from being carbonized due to a high temperature of a laser L during a cutting process, thereby preventing carbonized carbon fragments from remaining in edge gaps of the display panel, and improving a cleanliness of the product.

Technical solutions of the present disclosure will now be described in conjunction with specific embodiments.

Figure 3:
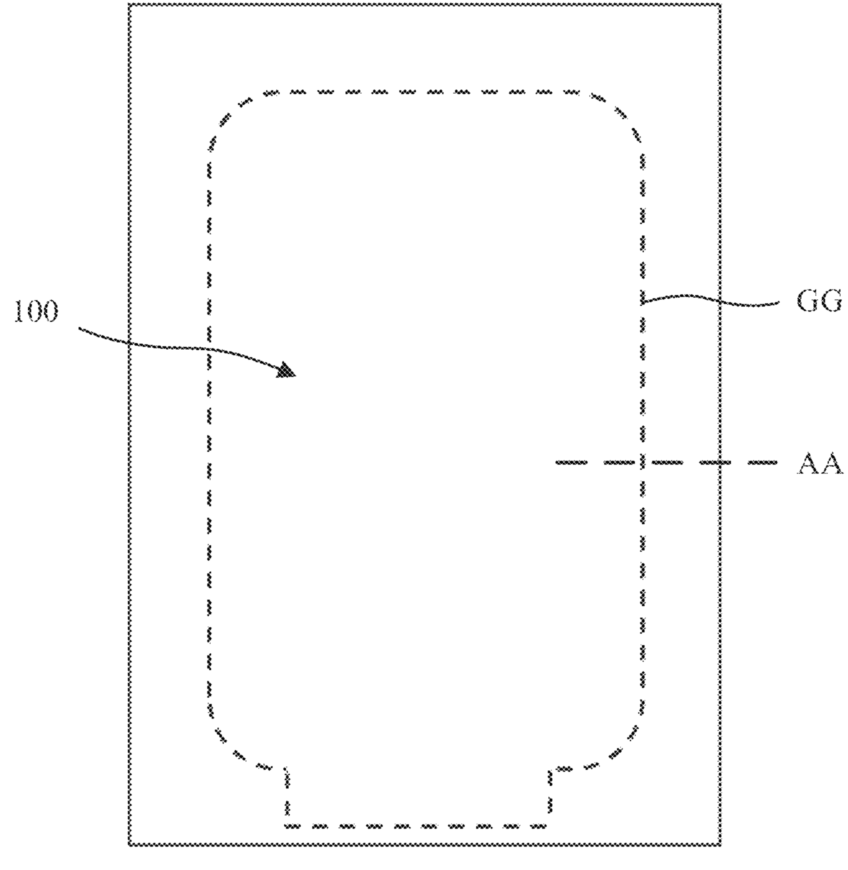
FIG. 3 is a schematic diagram of a display panel of the present disclosure when it is cut.

Referring to FIG. 3, a dotted line in FIG. 3 is a cutting track GG of a target panel. A shape enclosed by the cutting track GG is an outer shape of the display panel 100.

Figure 4:
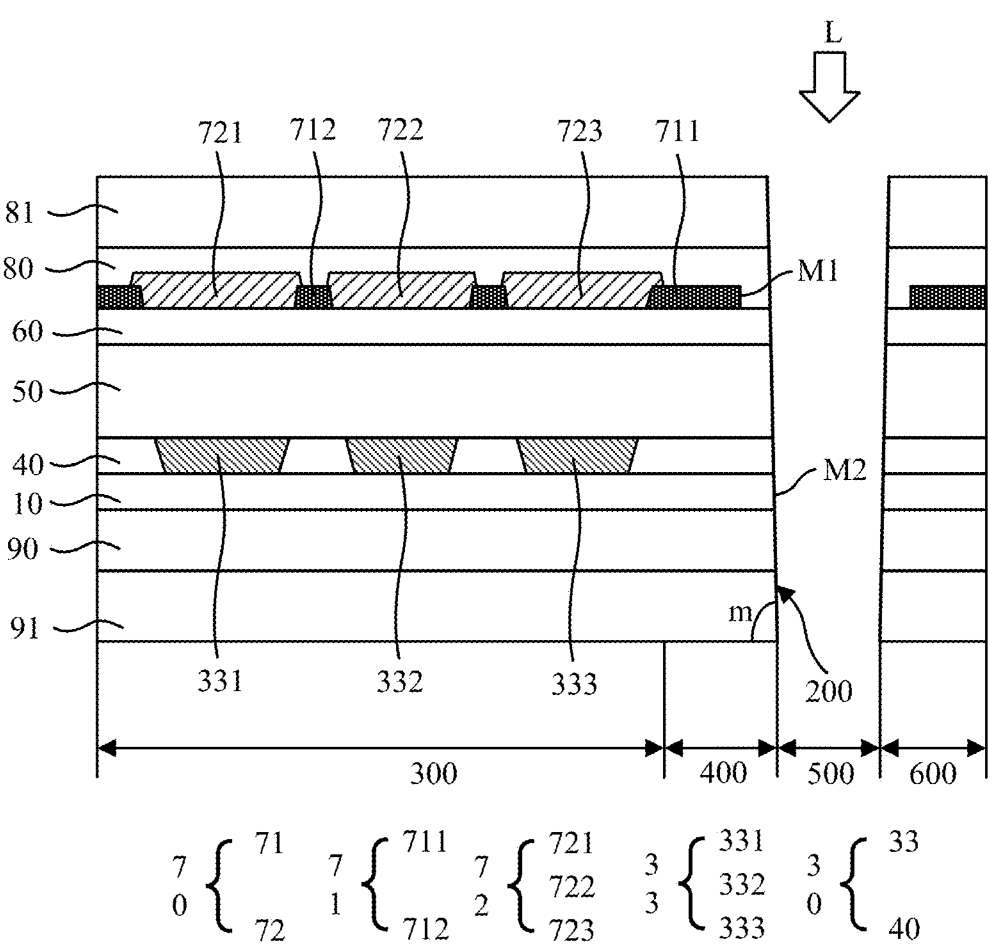
FIG. 4 is a first cross-sectional view taken along a section line AA in FIG. 3.
Figure 5:
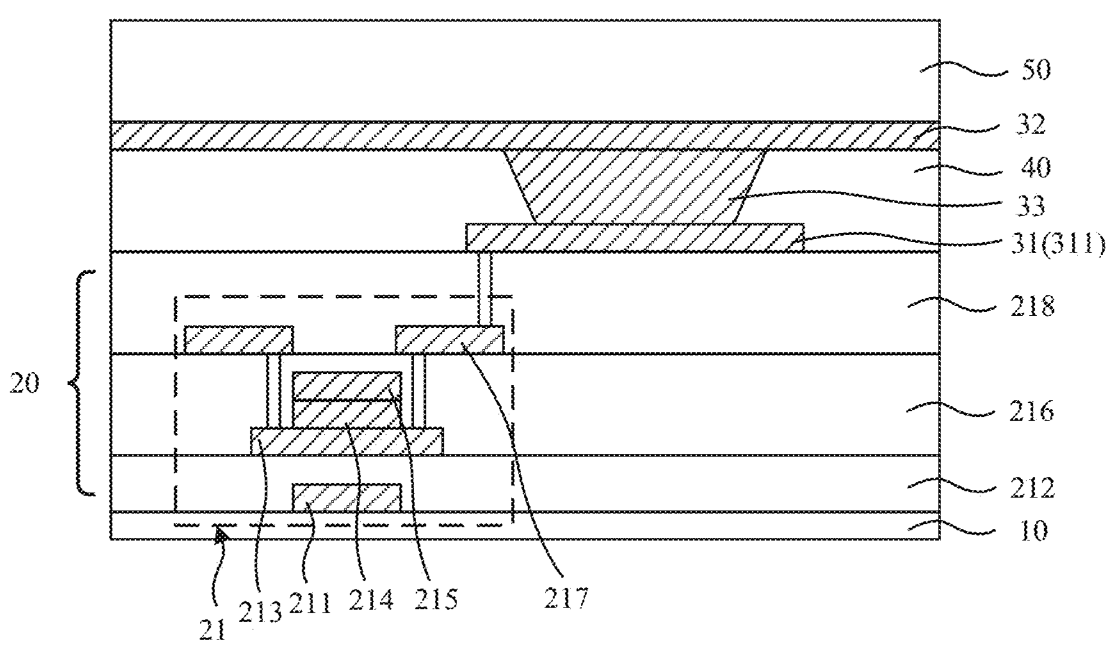
FIG. 5 is a detailed structure diagram of some film layers in FIG. 4.

Referring to FIG. 4 and FIG. 5, FIG. 4 is a first cross-sectional view taken along a section line AA in FIG. 3, and FIG. 5 is a detailed structure diagram of some film layers in FIG. 4.

The display panel 100 may include a thin film transistor array layer 20, a pixel definition layer 40, a light-emitting device layer 30, an encapsulation layer 50, a touch layer 60, a color film layer 70, a first planarization layer 80, and a first protective layer 81. The thin film transistor array layer 20 is disposed on the substrate 10. The pixel definition layer 40 is disposed on the thin film transistor array layer 20. The light-emitting device layer 30 and the pixel definition layer 40 are arranged in the same layer. The encapsulation layer 50 is disposed on the pixel definition layer 40. The touch layer 60 is disposed on the encapsulation layer 50. The color film layer 70 is disposed on the touch layer 60. The first planarization layer 80 is disposed on the color film layer 70. The first protective layer 81 is disposed on the first planarization layer 80.

In this embodiment, material of the substrate 10 may be glass, quartz, or polyimide.

In this embodiment, refer to FIG. 5, the thin film transistor array layer 20 may include a plurality of thin film transistors 21. The thin film transistors 21 may be of an etch stop type, a back channel etch type, or be divided into bottom-gate thin film transistors, top-gate thin film transistors, etc. according to positions of a gate and an active layer, which are not specifically limited. For example, the thin film transistors 21 shown in FIG. 5 are top-gate thin film transistors. The thin film transistors 21 may include a light-shielding metal layer 211, a buffer layer 212, an active layer 213, a gate insulating layer 214, a gate layer 215, an interlayer insulating layer 216, a source-drain layer 217, and a second planarization layer 218. The light-shielding metal layer 211 is disposed on the substrate 10. The buffer layer 212 is disposed on the light-shielding metal layer 211. The active layer 213 is disposed on the buffer layer 212. The gate insulating layer 214 is disposed on the active layer 213. The gate layer 215 is disposed on the gate insulating layer 214. The interlayer insulating layer 216 is disposed on the gate layer 215. The source-drain layer 217 is disposed on the interlayer insulating layer 216. The second planarization layer 218 is disposed on the source-drain layer 217.

In this embodiment, referring to FIG. 5, the display panel 100 may also include an anode layer 31 disposed on the second planarization layer 218, a light-emitting layer 33 disposed on the anode layer 31, and a cathode layer 32 disposed on the light-emitting layer 33. The anode layer 31 includes a plurality of anodes 311. The pixel definition layer 40 includes a plurality of pixel openings corresponding to the plurality of anodes 311 in a one-to-one manner. Each of the pixel openings corresponds to an upper surface of the anode 311. The light-emitting layer 33 may include a plurality of light-emitting pixels corresponding to the plurality of anodes 311 in a one-to-one manner.

In this embodiment, refer to FIG. 4, the encapsulation layer 50 covers the pixel definition layer 40, and continuously covers a plurality of pixel openings and a plurality of the light-emitting pixels. The encapsulation layer 50 may at least include a first inorganic encapsulation layer, a first organic encapsulation layer, and a second inorganic encapsulation layer stacked on the pixel definition layer 40.

In this embodiment, refer to FIG. 4, the touch layer 60 may include a first touch metal layer, a second touch metal layer, and an insulating layer. The first touch metal layer and the second touch metal layer are disposed on the encapsulation layer 50, and the insulating layer is disposed between the first touch metal layer and the second touch metal layer.

In this embodiment, the touch layer 60 provided in the embodiment of the present disclosure may be a mutual-capacitive type or a self-capacitive type.

In this embodiment, refer to FIG. 4, the color film layer 70 may be disposed on the touch layer 60. The color film layer 70 may include the light-shielding layer 71 and the plurality of color resist units 72 of different colors embedded in the light-shielding layer 71. One of the color resist units 72 corresponds to one of the light-emitting pixels. The color of the color resist units 72 is the same as the light emitted by the corresponding light-emitting pixels.

In this embodiment, refer to FIG. 4, the light-emitting layer 33 includes a first light-emitting pixel 331 that emit a first color, a second light-emitting pixel 332 that emit a second color, and a third light-emitting pixel 333 that emit a third color. The color film layer 70 includes a first color resist unit 721, a second color resist unit 722, and a third color resist unit 723. The first light-emitting pixel 331 corresponds to the first color resist unit 721. The second light-emitting pixel 332 corresponds to the second color resist unit 722. The third light-emitting pixel 333 corresponds to the third color resist unit 723.

In this embodiment, the first light-emitting pixel 331 is a red light-emitting pixel. The second light-emitting pixel 332 is a green light-emitting pixel. The third light-emitting pixel 333 is a blue light-emitting pixel. The first color resist unit 721 is a red color resist. The second color resist unit 722 is a green color resist. The third color resist unit 723 is a blue color resist.

In this embodiment, an orthographic projection of the first light-emitting pixel 331 on the first color resist unit 721 is within the first color resist unit 721. An orthographic projection of the second light-emitting pixel 332 on the second color resist unit 722 is within the second color resist unit 722. An orthographic projection of the third light-emitting pixel 333 on the third color resist unit 723 is within the third color resist unit 723.

In this embodiment, material of the first planarization layer 80 can be the same organic material as that of the second planarization layer 218.

In this embodiment, material of the first protective layer 81 may be a flexible material such as polyethylene terephthalate.

In this embodiment, the display panel 100 may further include a back plate 90 and a second protective layer 91 attached to the back plate 90. The back plate 90 is disposed on a side of the substrate 10 facing away from a light emitting direction. The second protective film is disposed on a side of the back plate 90 facing away from the light emitting direction.

In this embodiment, a function of the second protective layer 91 is the same as that of the first protective layer 81. Material of the second protective layer 91 may be the same as the material of the first protective layer 81.

In this embodiment, a separation force between the first protective layer 81 and the first planarization layer 80 ranges from 1 to 4 g/inch. A separation force between the second protective layer 91 and the back plate 90 ranges from 45 to 55 g/inch.

In this embodiment, the first protective layer 81 and the second protective layer 91 are intermediate products in a manufacturing process of the display panel 100. They only exist in a middle of the manufacturing process to protect the first planarization layer 80 and other film structures underneath. In a final product, the first protective layer 81 and the second protective layer 91 will be separated.

Referring to FIG. 4, the display panel 100 may include a display area 300 and a non-display area 400 disposed at a periphery of the display area 300. At the same time, a cutting area 500 and a cutting product 600 left by the cutting are provided on a side away from the non-display area 400.

During the cutting process of the display panel 100, the laser L needs to be used to cut the display panel 100. For example, in the structure in FIG. 4, a product on a left side of the cutting area 500 is a target product, and a product on a right side of the cutting area 500 is a useless cutting product 600.

Figure 6:
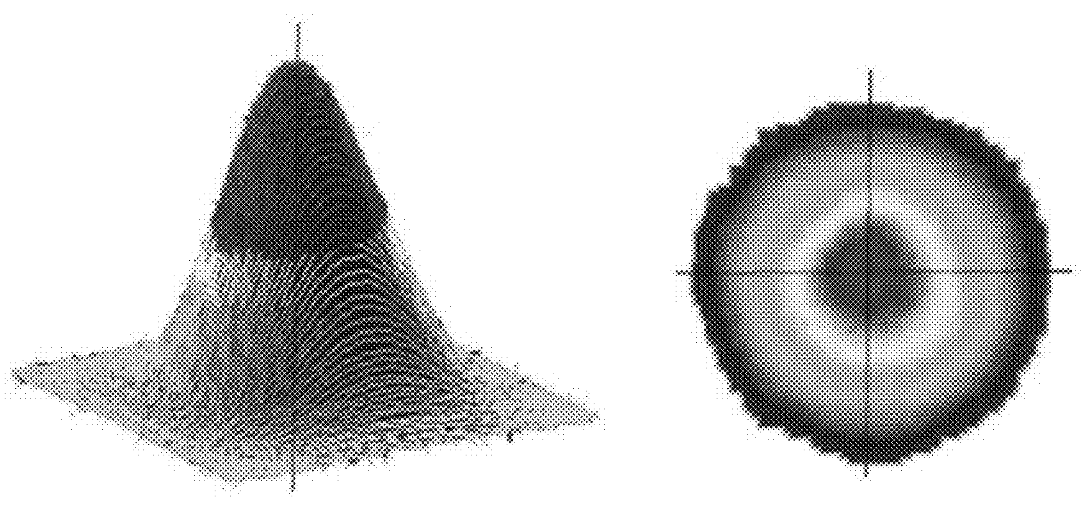
FIG. 6 is a schematic diagram of a Gaussian laser spot.

In this embodiment, a spot of the laser L is a Gaussian spot. Referring to FIG. 6, the laser L has characteristics of high energy in a middle and successively decreasing energy in surroundings. Therefore, a cross-section of the film after laser L cutting may show an inverted triangle shape as shown in FIG. 4.

In the display panel 100 of the present disclosure, refer to FIG. 4. In a direction from the substrate 10 to the color film layer 70, a distance between a film boundary on a side of the display panel 100 close to the cutting surface 200 and the second edge M2 gradually increase. That is, in the direction from the substrate 10 to the color film layer 70, without considering the patterning of each film layer, an outer contour area of the film layer in the display panel 100 gradually decreases.

In this embodiment, in addition to the characteristics of the laser L itself, an area of a film layer close to the light emission side can be smaller than an area of a film layer far from the light emission side since the film layer near the light emitting side has more organic materials (such as the first planarization layer 80, the color film layer 70, the organic encapsulation layer, and the pixel definition layer 40, etc.), and the high temperature of the laser L will carbonize the organic materials and produce carbon fragments that affect the cleanliness of the panel. That is, the distance between the boundary of the film layer near the light emission side and the second edge M2 is greater than the distance between the boundary of the film layer far from the light emission side and the second edge M2, so as to avoid the accumulation of the carbon fragments.

During the cutting process, as the laser L moves away from the light emitting side of the display panel 100, the cutting surface 200 of the display panel 100 is influenced by the characteristics of the laser L, so that the cutting surface 200 is an inclined surface with a certain inclination angle.

In this embodiment, an acute angle m between the cutting surface 200 and the substrate 10 may range from 60° to 80°. The acute angle m may be an actual included angle between the cutting surface 200 and the substrate 10. Due to the characteristics of the laser L, it is possible to control an energy of the laser L to make the angle between the cutting surface 200 and the substrate 10 as close as possible to 90°. At present, due to the limitation of the process, it can only reach 80°, and the angle between a side edge of the display panel 100 and the substrate 10 can be close to 90° by edging or other treatments.

In the display panel 100 of the present disclosure, the display panel 100 includes a plurality of organic layers, and one side of at least one of the organic layers close to the cutting surface 200 is provided with a black material.

In this embodiment, the display panel 100 includes organic layers such as the first planarization layer 80, the color film layer 70, the organic encapsulation layer, and the pixel definition layer 40, so the high temperature of the laser L may carbonize the organic material. Therefore, after the cutting process is completed, there may be residual carbon fragments in edge areas of the above-mentioned film layers. In a subsequent edging process, the carbon fragments cannot be completely removed and may remain on the cutting surface 200. At the same time, the carbonized organic layers are attached to the sides of the organic layers, which can protect the organic materials in the display area 300, such as blocking water and oxygen.

Figure 7:
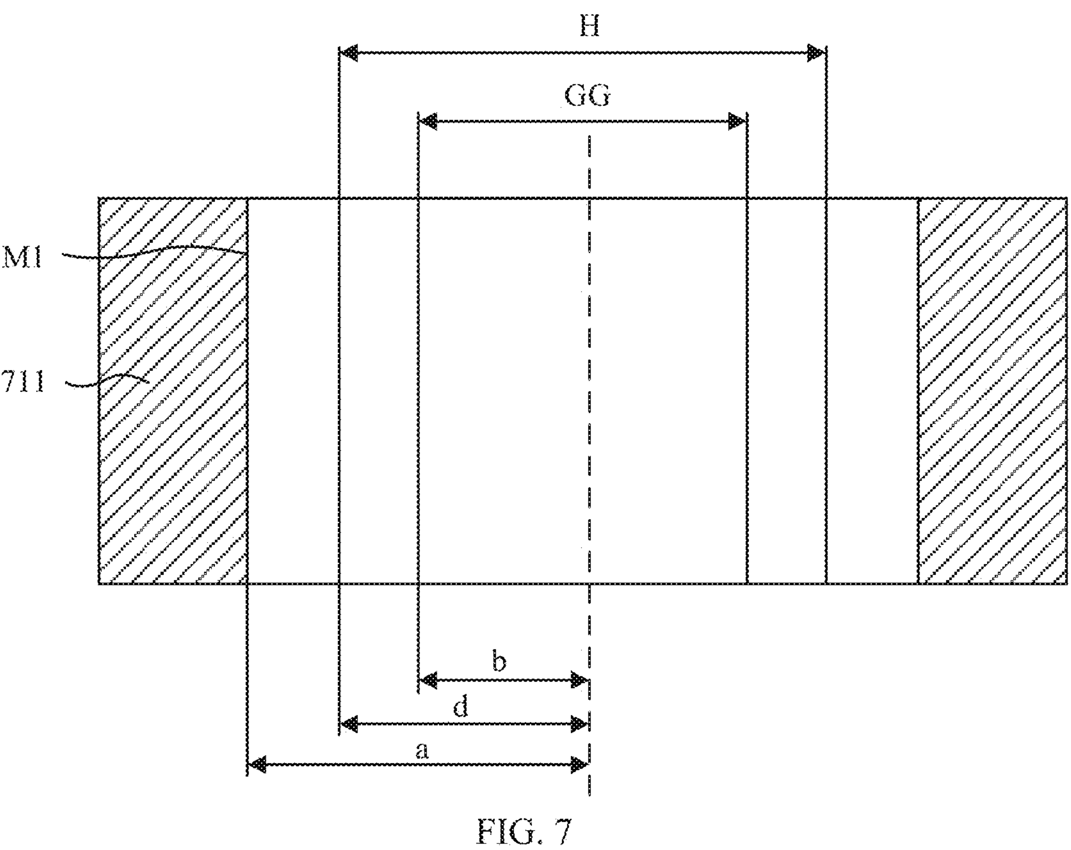
FIG. 7 is a top view of a cutting area of a display panel of the present disclosure.
Figure 8:
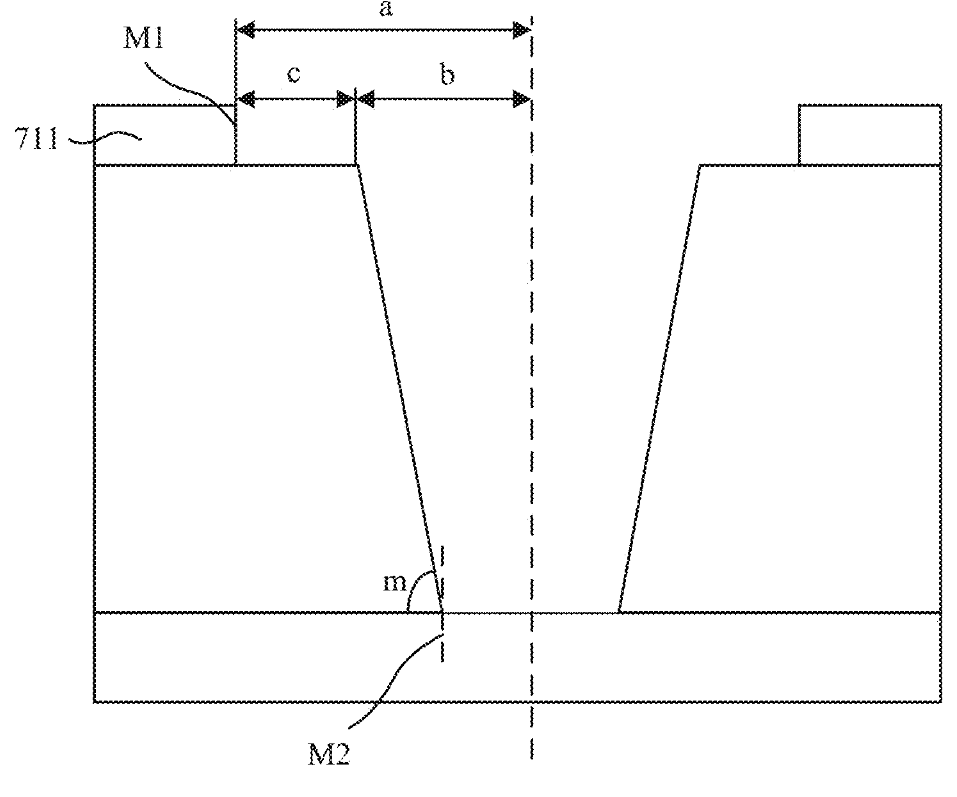
FIG. 8 is a cross-sectional view of the cutting area of the display panel of the present disclosure.

Structures shown in FIG. 7 and FIG. 8 are a top view and a cross-sectional view of the display panel before the display panel is completely cut. The existing display panel generally uses the laser L to cut a mother board. The high temperature of the laser L has a certain carbonization effect on the organic materials. Therefore, in the present disclosure, the light-shielding material that may be carbonized is separated from the cutting area 500.

In the display panel 100 of the present disclosure, the light-shielding layer 71 includes a first light-shielding portion 711 close to the cutting surface 200 of the display panel 100. A distance between the first edge M1 of the first light-shielding portion 711 and the cutting surface 200 is greater than or equal to 50 micrometers and less than or equal to 150 micrometers.

Referring to FIG. 7 and FIG. 8, in the drawings, an area a is a distance between a boundary of the light-shielding portion and a center of the cutting track GG, an area b is a width of the cutting track GG, and an area d is a heat-affected zone H of the laser L. That is, the structure in area b will be cut. The structure in area d will be affected by the high temperature of the laser L. Therefore, in order to prevent the light-shielding material from being carbonized due to the high temperature of the laser L, in the present disclosure, the boundary of the first light-shielding portion 711 needs to be far away from the area affected by the laser L, that is, a needs to be greater than d.

In this embodiment, a range of a difference c between a and b may be: 50 um≤c≤150 um. That is, a minimum distance between a boundary of the first light-shielding portion 711 and a boundary of the cutting track GG is 50 micrometers, and a maximum distance is 150 micrometers.

In this embodiment, the first light-shielding portion 711 is arranged away from the center of the cutting track GG, so that the light-shielding material in the non-display area 400 has a certain distance from the center of the cutting track GG. It prevents the higher temperature of the laser L from carbonizing the light-shielding material, and prevents the residual carbon fragments between the first protective layer 81 and the planarization layer.

Figure 9:
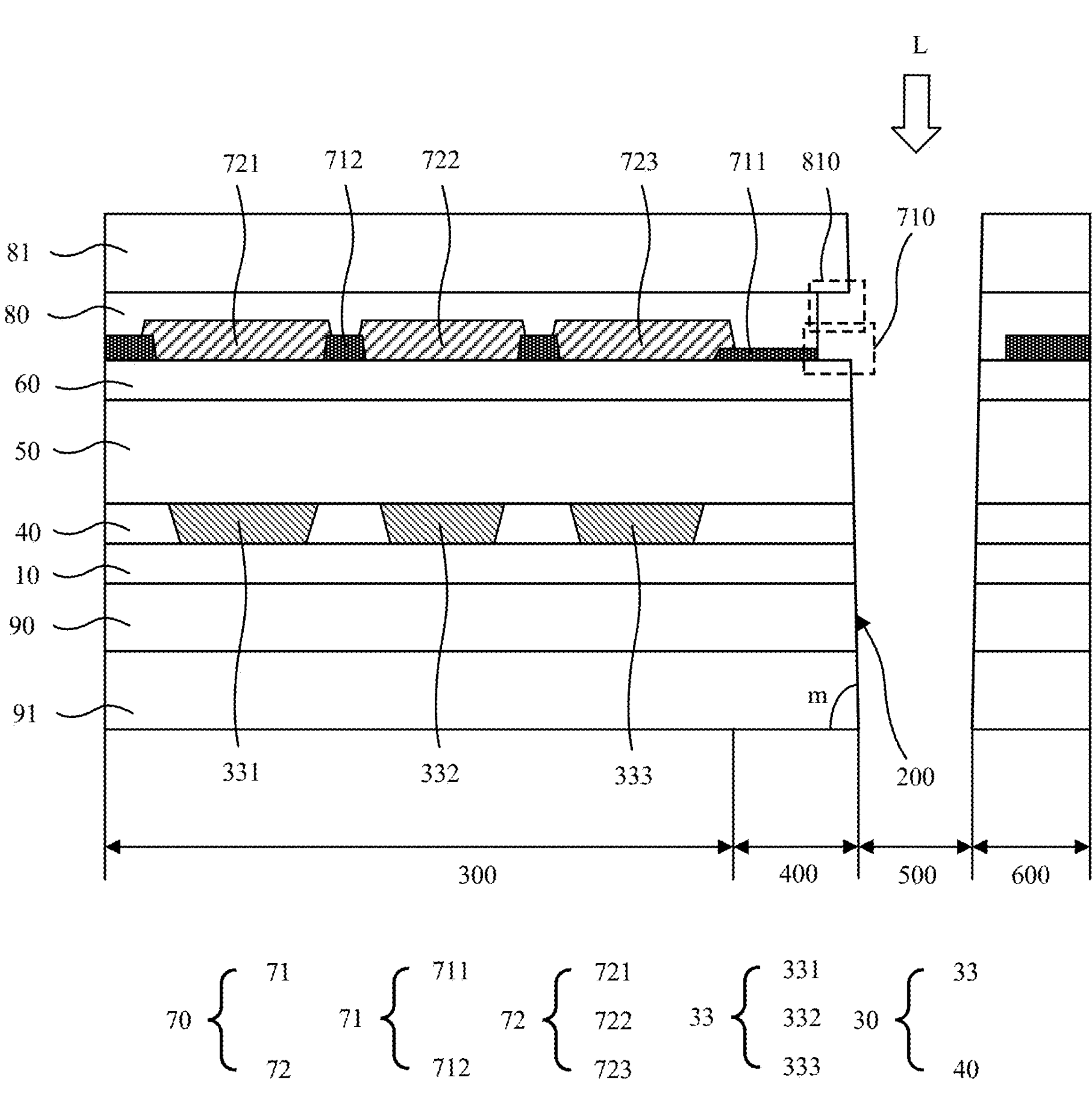
FIG. 9 is a second cross-sectional view taken along a section line AA in FIG. 3.

In the display panel 100 of the present disclosure, refer to FIG. 9. The light-shielding layer 71 also includes a second light-shielding portion 712 away from the cutting surface 200. A thickness of the second light-shielding portion 712 is greater than a thickness of the first light-shielding portion 711.

In this embodiment, the light-shielding layer 71 may include the second light-shielding portion 712 disposed in the display area 300 and the first light-shielding portion 711 disposed in the non-display area 400. The first light-shielding portion 711 is arranged close to the cutting surface 200. That is, when the display panel 100 is being cut, the distance between the boundary of the first light-shielding portion 711 and the laser L with the higher temperature is small. Thus, there is a possibility that the laser L carbonizes the boundary of the first light-shielding portion 711. The present disclosure reduces the thickness of the first light-shielding portion 711. When the first light-shielding portion 711 is carbonized, the generation of the carbon fragments can be reduced, and the residual amount of the carbon fragments between the first protective layer 81 and the planarization layer can be improved.

In the display panel 100 of the present disclosure, the display panel 100 further includes a first planarization layer 80 disposed on the color film layer 70. The first planarization layer 80 covers the color film layer 70. The first planarization layer 80 may cover the first light-shielding portion 711 and extend to the cutting surface 200.

Figure 10:
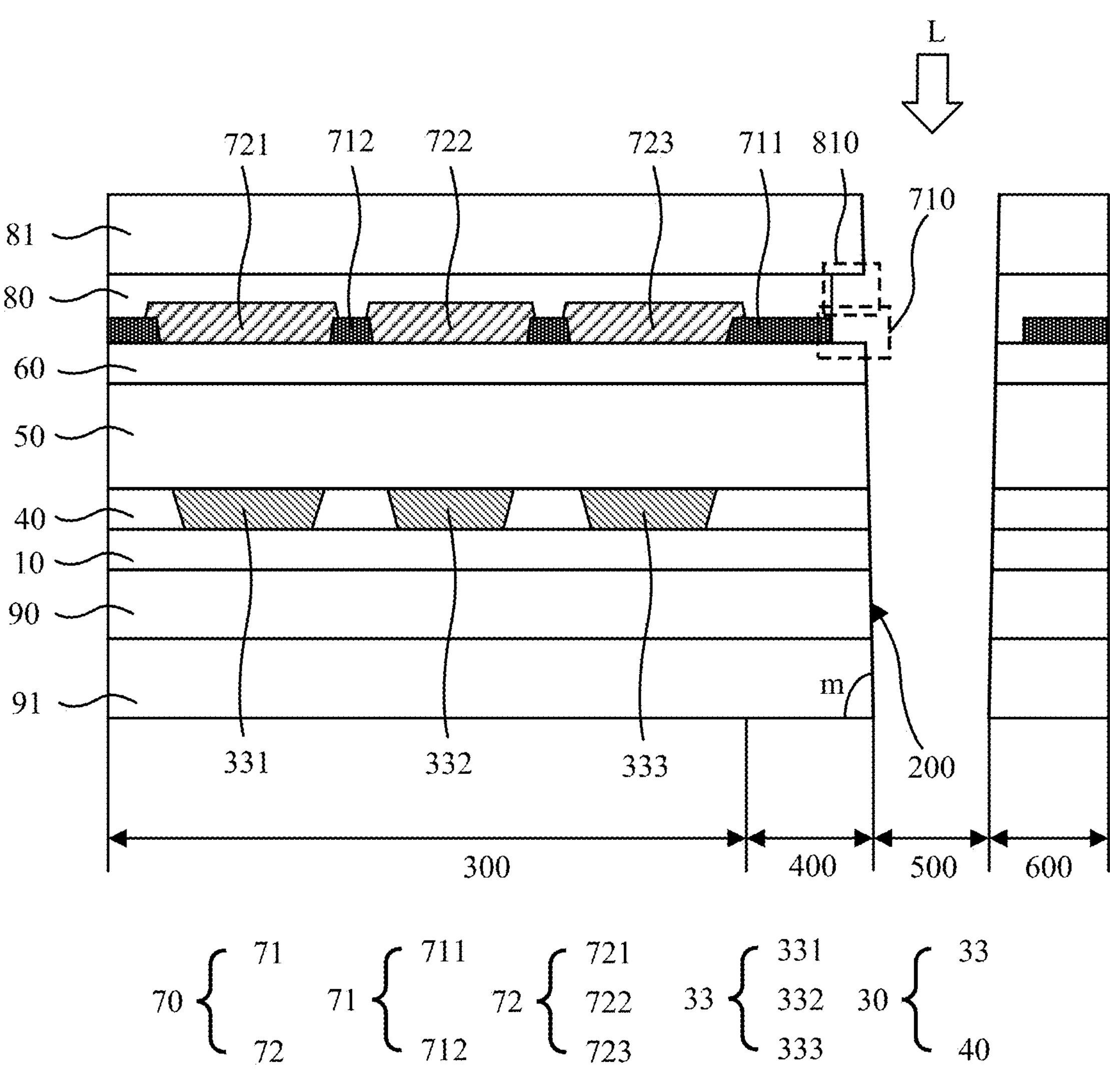
FIG. 10 is a third cross-sectional view taken along a section line AA in FIG. 3.

Referring to FIG. 9 and FIG. 10, an area of the light-shielding layer 71 close to the cutting surface 200 of the display panel 100 is provided with a first notch 710. The first notch 710 faces the cutting surface 200. At the same time, the area of the first planarization layer 80 close to the cutting surface 200 is provided with a second notch 810. The second notch 810 faces the cutting surface 200.

Referring to FIG. 9 and FIG. 10, since the thicknesses of the color resist units 72 and the light-shielding layer 71 are inconsistent, the flatness of the color film layer 70 is low after the color film process is completed. Therefore, the first planarization layer 80 needs to be provided on the color film layer 70. Moreover, the first planarization layer 80 is made of organic materials. When the cutting process is performed by the laser L, material of the planarization layer can also be carbonized to form black carbon fragments. Therefore, the first planarization layer 80 cannot be provided with the material of the planarization layer on the side close to the cutting surface 200.

Figure 11:
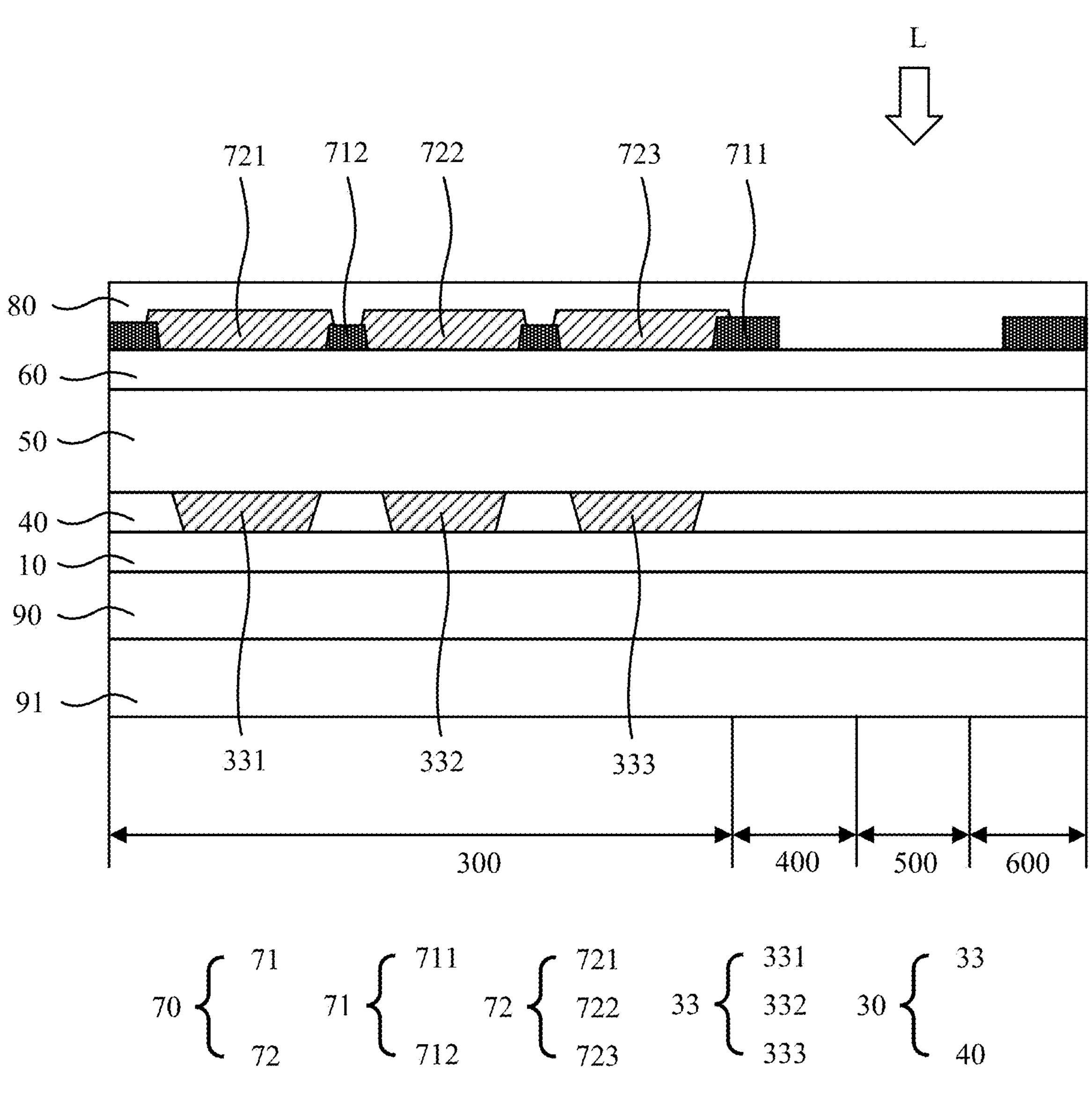
FIG. 11 is a fourth cross-sectional view taken along a section line AA in FIG. 3.

Referring to FIG. 11, which is a cross-sectional view taken along the section line AA of the display panel 100 of the present disclosure before cutting. Portions of the display panel 100 and the first planarization layer 80 on the side close to the cutting track GG are removed. Both the first planarization layer 80 and the light-shielding layer 71 can be made of photoresist type organic materials. Therefore, the removal portions can be formed by a photomask process. For example, through an exposure and development process, edges of the first planarization layer 80 and the light-shielding layer 71 are removed, so that a boundary between the first planarization layer 80 and the light-shielding layer 71 is far away from the cutting track GG.

In this embodiment, the second notch 810 corresponds to the first notch 710. An area of the second notch 810 may be greater than or equal to an area of the first notch 710 to further increase a distance between a boundary of the second notch 810 and the cutting surface 200.

In the present disclosure, the second notch 810 is formed in the area of the first planarization layer 80 close to the cutting surface 200 to keep the boundary of the first planarization layer 80 away from the cutting surface 200. That is, the boundary of the first planarization layer 80 is kept away from the cutting track GG. It prevents the organic material constituting the first planarization layer 80 from being carbonized by the high temperature of the laser L, and prevents carbonized carbon fragments from remaining between the first planarization layer 80 and the first protective layer 81.

In the display panel 100 of the present disclosure, refer to FIG. 4, a thickness of the first planarization layer 80 may be less than or equal to a thickness of the second light-shielding portion 712. Since the first planarization layer 80 is arranged close to the cutting surface 200, in order to prevent the first planarization layer 80 from being carbonized by the laser L, the present disclosure can reduce the thickness of the first planarization layer 80.

In this embodiment, the first planarization layer 80 is mainly used to flatten the surface of the uneven color film layer 70. Therefore, the first planarization layer 80 only needs to ensure the flatness of the surface of the color film layer 70. That is, a minimum thickness of the first planarization layer 80 is a difference between the thicknesses of the color resist unit 72 and the light-shielding layer 71 to ensure that the thickness of the area corresponding to the light-shielding layer 71 is the same as the thickness of the area corresponding to the color resist unit 72.

Figure 12:
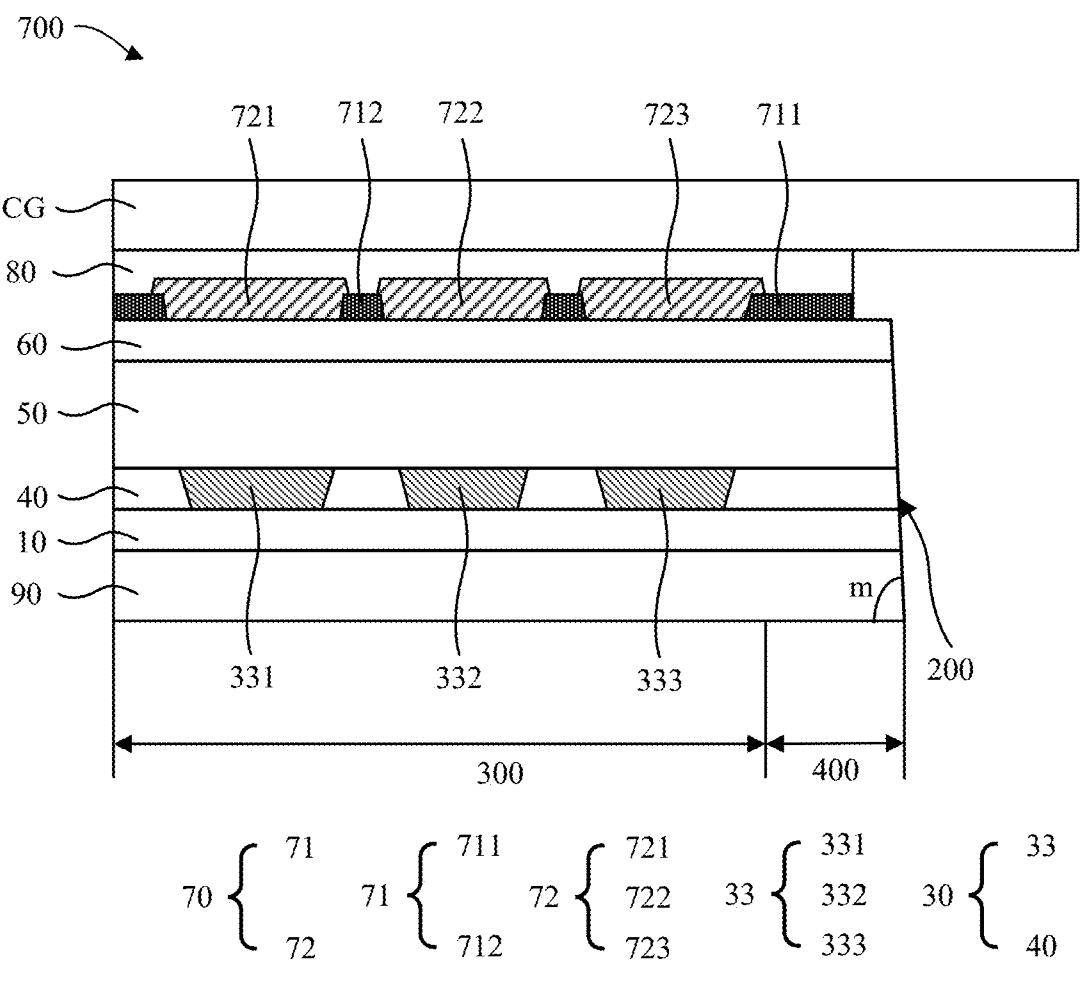
FIG. 12 is a schematic diagram of a structure of a display module of the present disclosure.
Figure 13:
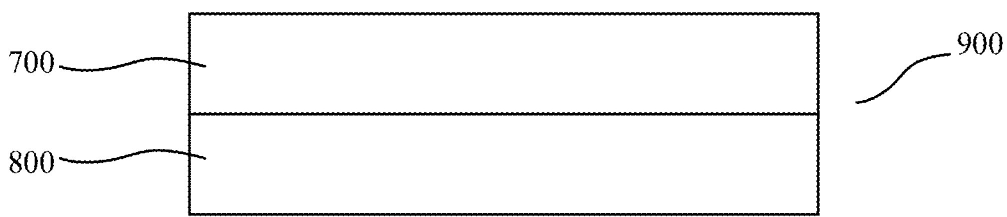
FIG. 13 is a schematic diagram of a structure of a mobile terminal of the present disclosure.

The present disclosure also proposes a display module 700. Referring to FIG. 12, the display module 700 includes the above display panel 100 and a cover layer CG disposed on the display panel 100. An orthographic projection of the display panel 100 on the cover layer is within the cover layer CG.

In this embodiment, compared with the structure in FIG. 4, the structure in FIG. 12 removes the first protective layer 81 and the second protective layer 91 in FIG. 4. Also, the first planarization layer 80 and the cover layer CG of the display panel 100 can be adhered by an optical adhesive.

In this embodiment, the cover layer CG mainly protects an underlying panel structure. Therefore, in a top view of the display module 700, an outer boundary of the cover layer CG should be larger than an outer boundary of the display panel 100.

The present disclosure also proposes a mobile terminal 900, which includes a terminal body 800 and the above-mentioned display module 700. The terminal body 800 and the display module 700 are assembled together. The terminal body can be a circuit board and other devices bound to the display module. The mobile terminal may include an electronic device such as a mobile phone, a television, and a notebook computer.

The present disclosure discloses the display panel, the display module, and the mobile terminal. The display panel includes the substrate, the light-emitting device layer disposed on the substrate, and the color film layer disposed on the light-emitting device layer. The color film layer includes the light-shielding layer and the plurality of color resist units embedded in the light-shielding layer. The light-shielding layer includes the first light-shielding portion arranged close to the cutting surface of the display panel. The first light-shielding portion includes the first edge on the side close to the cutting surface. The substrate includes the second edge close to the cutting surface. In the present disclosure, the distance between the first edge and the cutting surface is greater than the distance between the second edge and the cutting surface, so that the light-shielding layer is separated from the cutting surface. It prevents the light shielding material from being carbonized due to a high temperature of the laser L during a cutting process, thereby preventing carbonized carbon fragments from remaining in edge gaps of the display panel, and improving a cleanliness of the product.

It can be understood that for those of ordinary skill in the art, equivalent replacements or changes can be made according to the technical solutions of the present disclosure and its inventive concept, and all these changes or replacements shall fall within the protection scope of the claims attached to the present disclosure.

What is claimed is:

1. A display panel, comprising:

a substrate;

a light-emitting device layer disposed on the substrate; and a color film layer disposed on the light-emitting device layer, wherein the color film layer comprises a light-shielding layer and a plurality of color resist units embedded in the light-shielding layer, the light-shielding layer comprises a first light-shielding portion disposed close to a cutting surface of the display panel and a second light-shielding portion away from the cutting surface, the cutting surface extends through the color film layer, the light-emitting device layer and the substrate sequentially, the first light-shielding portion and the second light-shielding portion are arranged in the same light-shielding layer, the first light-shielding portion has a first thickness defined from an uppermost surface to a bottommost surface, and the second light-shielding portion has a second thickness defined from an uppermost surface to a bottommost surface;

wherein the first light-shielding portion comprises a first edge close to the cutting surface, the substrate comprises a second edge close to the cutting surface, the first light-shielding portion extends throughout an entirety of the first thickness in a cutting direction, the second light-shielding portion extends throughout an entirety of the second thickness in the cutting direction, the first edge extends throughout entirety of the first thickness in the cutting direction, a distance between the first edge and the cutting surface, over the entirety of the first thickness, is greater than a distance between the second edge and the cutting surface, and wherein the second light-shielding portion is disposed in a display area of the display panel, the first light-shielding portion is disposed in a non-display area of the display panel, and the second thickness of the second light-shielding portion is greater than the first thickness of the first light-shielding portion, wherein the distance between the first edge and the cutting surface is greater than or equal to 50 micrometers and less than or equal to 150 micrometers over the entirety of the first thickness.

2. The display panel according to claim 1, wherein the display panel further comprises a first planarization layer disposed on the color film layer, and the first planarization layer covers the color film layer.

3. The display panel according to claim 2, wherein the first planarization layer covers the first light-shielding portion and extends to the cutting surface.

4. The display panel according to claim 2, wherein an area of the light-shielding layer close to the cutting surface of the display panel is provided with a first notch, an area of the first planarization layer close to the cutting surface is provided with a second notch, and the first notch and the second notch face the cutting surface.

5. The display panel according to claim 2, wherein a thickness of the first planarization layer is less than or equal to the thickness of the second light-shielding portion.

6. The display panel according to claim 1, wherein in a direction from the substrate towards the color film layer, a distance between a boundary on a side of each of film layers except for the substrate in the display panel close to the cutting surface and the second edge gradually increases.

7. The display panel according to claim 6, wherein an acute angle between the cutting surface and the substrate ranges from 60° to 80°.

8. The display panel according to claim 1, wherein the display panel comprises a plurality of organic layers, one side of at least one of the organic layers close to the cutting surface is provided with a black material.

9. A display module, comprising a display panel and a cover layer disposed on the display panel, wherein an orthographic projection of the display panel on the cover layer is within the cover layer, and the display panel comprises:

a substrate;

a light-emitting device layer disposed on the substrate; and a color film layer disposed on the light-emitting device layer, wherein the color film layer comprises a light-shielding layer and a plurality of color resist units embedded in the light-shielding layer, the light-shielding layer comprises a first light-shielding portion disposed close to a cutting surface of the display panel and a second light-shielding portion away from the cutting surface, the cutting surface extends through the color film layer, the light-emitting device layer and the substrate sequentially, the first light-shielding portion and the second light-shielding portion are arranged in the same light-shielding layer, the first light-shielding portion has a first thickness defined from an uppermost surface to a bottommost surface, and the second light-shielding portion has a second thickness defined from an uppermost surface to a bottommost surface;

wherein the first light-shielding portion comprises a first edge close to the cutting surface, the substrate comprises a second edge close to the cutting surface, the first light-shielding portion extends throughout an entirety of the first thickness in a cutting direction, the second light-shielding portion extends throughout an entirety of the second thickness in the cutting direction, the first edge extends throughout the entirety of the first thickness in the cutting direction, a distance between the first edge and the cutting surface, over the entirety of the first thickness, is greater than a distance between the second edge and the cutting surface, and wherein the second light-shielding portion is disposed in a display area of the display panel, the first light-shielding portion is disposed in a non-display area of the display panel, and the second thickness of the second light-shielding portion is greater than the first thickness of the first light-shielding portion, wherein the distance between the first edge and the cutting surface is greater than or equal to 50 micrometers and less than or equal to 150 micrometers over the entirety of the first thickness.

10. The display module according to claim 9, wherein the display panel further comprises a first planarization layer disposed on the color film layer, and the first planarization layer covers the color film layer.

11. The display module according to claim 10, wherein the first planarization layer covers the first light-shielding portion and extends to the cutting surface.

12. The display module according to claim 10, wherein an area of the light-shielding layer close to the cutting surface of the display panel is provided with a first notch, an area of the first planarization layer close to the cutting surface is provided with a second notch, and the first notch and the second notch face the cutting surface.

13. The display module according to claim 10, wherein a thickness of the first planarization layer is less than or equal to the thickness of the second light-shielding portion.

14. The display module according to claim 9, wherein in a direction from the substrate towards the color film layer, a distance between a boundary on a side of each of film layers except for the substrate in the display panel close to the cutting surface and the second edge gradually increases.

15. The display module according to claim 9, wherein the display panel comprises a plurality of organic layers, one side of at least one of the organic layers close to the cutting surface is provided with a black material.

16. A mobile terminal, comprising a terminal body and the display module according to claim 9, wherein the terminal body and the display module are assembled together.

* * * * *